United States Patent [19]

Asai et al.

[11] 4,034,244

[45] July 5, 1977

[54] RESONANT CYLINDRICALLY SHAPED ULTRASONIC WAVE GENERATOR

[75] Inventors: Kiyokazu Asai; Akihiro Takeuchi, both of Nagoya, Japan

[73] Assignee: Kabushiki Kaisha Toyota Chuo Kenkyusho, Nagoya, Japan

[22] Filed: Sept. 5, 1975

[21] Appl. No.: 610,799

Related U.S. Application Data

[63] Continuation of Ser. No. 453,987, March 22, 1974, abandoned.

[30] Foreign Application Priority Data

Mar. 30, 1973 Japan ............................ 48-365.04

[52] U.S. Cl. ................................ 310/8.2; 310/8.7

[51] Int. Cl.² ........................................ H01L 41/04

[58] Field of Search ................. 310/8, 8.2, 8.3, 8.7, 310/26; 116/137 A, DIG. 19; 73/67.2; 259/1 R, DIG. 15, DIG. 41, DIG. 44; 239/2, 4; 74/1 SS

[56] References Cited

UNITED STATES PATENTS

| | | | |
|---|---|---|---|
| 2,190,666 | 2/1940 | Kallmeyer | 310/26 X |
| 2,725,219 | 11/1955 | Firth | 310/26 X |
| 3,015,961 | 1/1962 | Roney | 340/8 MM |
| 3,103,310 | 9/1963 | Lang | 239/102 X |
| 3,184,841 | 5/1956 | Jones et al. | 310/26 X |
| 3,214,101 | 10/1965 | Perron | 310/8.7 X |
| 3,400,892 | 9/1968 | Ensminger | 239/102 |

*Primary Examiner*—Mark O. Budd
*Attorney, Agent, or Firm*—Spensley, Horn and Lubitz

[57] ABSTRACT

The ultrasonic wave generator incorporates an ultrasonic-frequency vibratory member of cylindrical shape from which ultrasonic waves are produced, and the vibratory member is securely connected of its outer cylindrical surface to the mechanical vibration output end of a metallic block amplifier member which in turn is connected to an ultrasonic electromechanical transducer of the piezoelectric type, etc. The cylindrically shaped vibratory member effects a motion of flexural vibrations in the radial direction throughout its extensive areas, producing large-amplitude ultrasonic waves.

8 Claims, 6 Drawing Figures

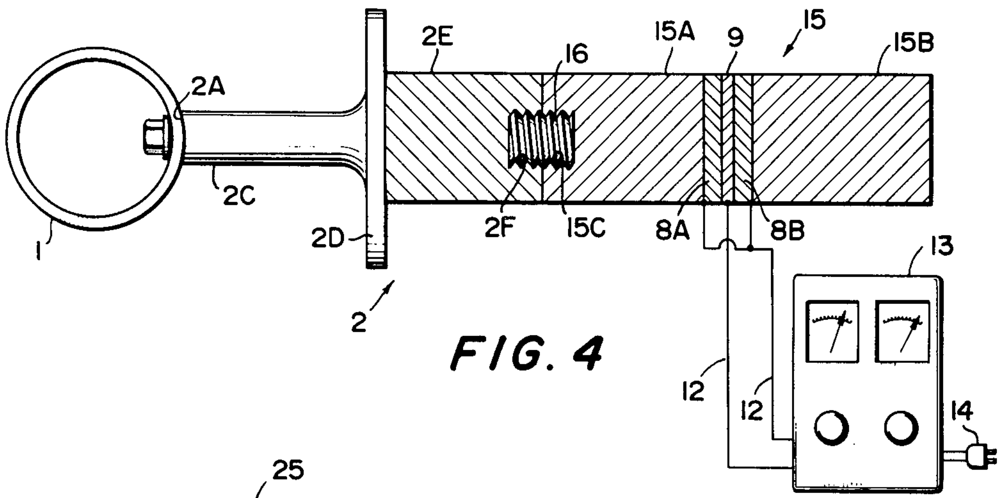
FIG. 4
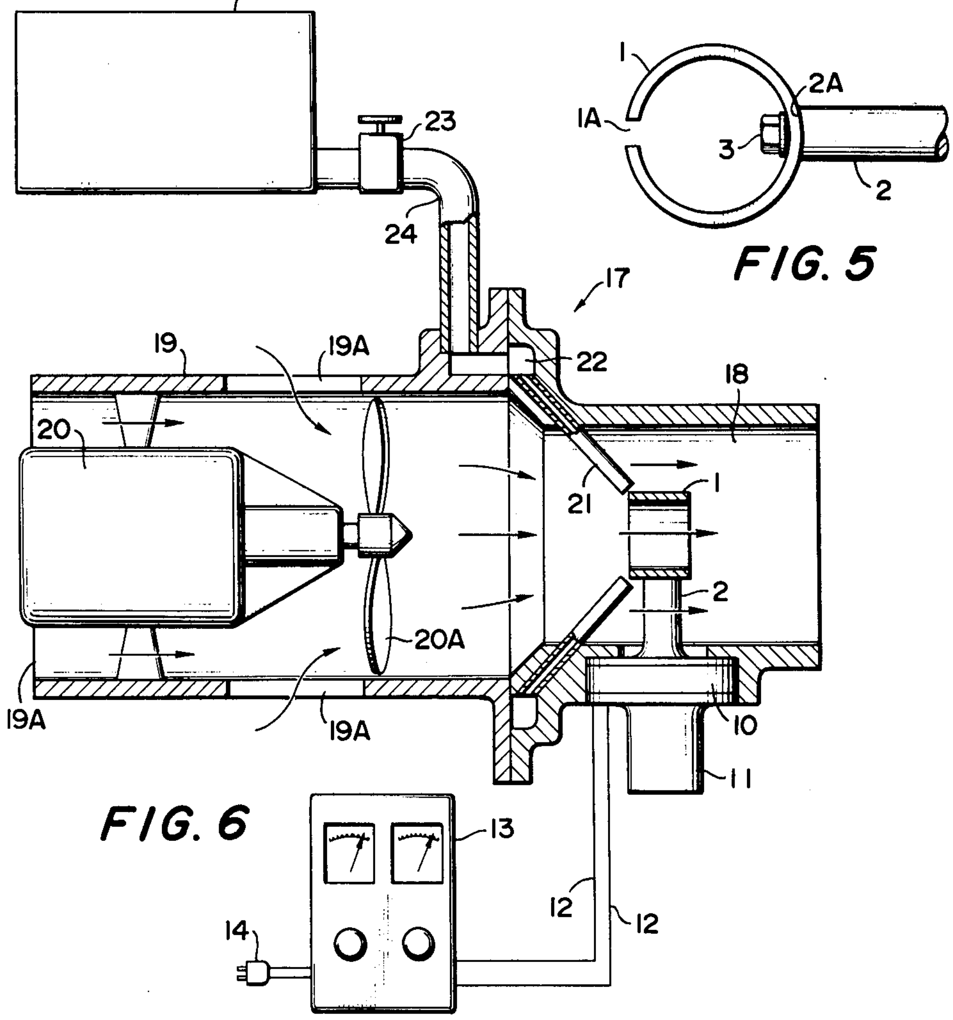
FIG. 5
FIG. 6

RESONANT CYLINDRICALLY SHAPED ULTRASONIC WAVE GENERATOR

This is a continuation of application Ser. No. 453,987, filed Mar. 22, 1974, now abandoned.

BACKGROUND OF THE INVENTION

1. FIELD OF THE INVENTION

This invention relates to an ultrasonic wave generator, and more particularly to such generator having a vibratory member for producing large-amplitude ultrasonic waves.

2. Prior Art

Generally, an ultrasonic wave generator in common use has heretofore been of the type essentially comprising an ultrasonic electromechanical transducer, an ultrasonic horn and an ultrasonic frequency oscillator, or that comprising a cylindrically shaped ultrasonic electromechanical transducer and an ultrasonic frequency oscillator.

In the former type using the ultrasonic horn, the arrangement is such that electrical vibrations from the ultrasonic frequency oscillator be transformed into mechanical vibrations (longitudinal vibrations) by the ultrasonic electromechanical transducer of either the piezo-electrical type incorporating piezoelectric elements such for example as PZT, or the magnetostrictive type incorporating magnetostrictive elements such as ferrite; and the thus produced mechanical vibrations be transmitted to the ultrasonic horn connected to the output end of the electromechanical transducer, so that the vibrations which have been increased in amplitude by the same horn are released in the form of ultrasonic waves from the mechanical vibration output end of the horn.

As is commonly known in this arrangement, the ultrasonic horn serves the purpose of amplitude magnification, because the amplitude of any ultrasonic wave obtainable with the ordinary electromechanical transducer is significantly small, such for examples as 4 $\mu$ (peak to peak) at maximum with a 40 KHz-transducer. With respect to that magnification, also, its value is determined by a function of the area ratio $S_2/S_1$ in the horn, wherein $S_2$ is the cross-sectional area at the mechanical vibration input end and $S_1$ that at the mechanical vibration output end, or the amplifying power will be greater as the area ratio increases. To describe more specifically, the amplifying power is determinable in such a manner that with a "stepped" horn having step-like varied cross-section, it is determined by the value of $S_2/S_1$; with an "exponential" horn exponentially tapered, it is by the square root of $S_2/S_1$; and with a "conical" horn linearly tapered, it is determined by a function of the square root of $S_2/S_1$.

On the other hand, with respect to the geometrical requirements of the ultrasonic horn, it is commonly necessary that for attainment of an efficient amplification of ultrasonic vibrational amplitudes, the diameter of the horn at the input end be not exceeding one fourth of a wavelength $\lambda$ of the ultrasonic wave, while its length being chosen so as to enable the horn to effect longitudinal resonant vibrations at the same frequencies as those provided by the transducer.

It follows, therefore, that the maximum amplification power of enlarging amplitudes of ultrasonic vibrations by the horn will be determined of its value as obtainable with the maximum diameter of the input end, i.e., $\lambda/4$ and the minimized area of the output end.

However, in the above arrangement of ultrasonic wave generating system, the problem lies in that when providing the horn with such higher rates of amplification, the mechanical vibration output end of the horn is much reduced in area, as for example about 0.9 cm in diameter in relation to the input end of 3 cm dia., under the conditions of 40 KHz and 10 amplifications. This has thus formed a known drawback of the ordinary ultrasonic wave generator that in practice, ultrasonic vibrations of large amplitudes are only applicable to rather a limited working zone.

Further, as regards another type using the cylindrically shaped ultrasonic electromechanical transducer wherein piezoelectrical elements such as PZT are in the cylindrical form, it is arranged that electric oscillations are transformed by the cylindrical transducer into mechanical vibrations. This arrangement is admittedly advantageous in respect to an enlarged area of vibration because of its cylindrical shape. However, as the entire surface of the cylinder effects a uniform ultrasonic vibrational motion in the radial direction, it is not attainable to amplify the vibration by means of an ultrasonic horn in such a manner as described with respect to the previous arrangement of the prior art. Hence, this arrangement also has involved a drawback that since the maximum amplitude of vibration obtainable is specifically limited, as for example below 4 $\mu$ (peak to peak) with a 40 KHz-transducer, the arrangement is by no means suited to the purpose of a large-amplitude ultrasonic wave generator.

SUMMARY OF THE INVENTION

According to the invention, there is provided an ultrasonic wave generator comprising an ultrasonic frequency oscillator, an ultrasonic electromechanical transducer for transforming electric oscillations generated by said ultrasonic frequency oscillator into mechanical longitudinal vibrations, an amplifier member for amplification of ultrasonic vibrations integrally connected to the output end of said ultrasonic electromechanical transducer, and a hollow cylindrically shaped ultrasonic frequency vibratory member which has a side circular wall having a predetermined length or height between opposite ends of the cylinder shape and a constant wall thickness in the axial direction over the entire range of its height or predetermined length and a constant thickness around the circumference of the cylinder shaped hollow form and integrally connected to the output end of said amplifier member with the axis thereof being in perpendicular relation to the axis of the amplifier member. With this structure it is contemplated that through the above ultrasonic electromechanical, transducer such as for example in the form of a piezoelectric type transducer or a magnetostrictive type transducer, electric oscilations externally applied be transformed into mechanical vibrations; the mechanical vibrations be then amplified of their amplitudes by means of the amplifier; the thus amplified vibrations be transmitted to the vibratory hollow cylindrical member, so that the vibratory member effects flexural vibrations of large amplitudes in the radial direction; and hence ultrasonic waves be produced from the extensive area of the vibratory member including inner and outer cylindrical surfaces.

It is to be noted, in this arrangement, that the ultrasonic-frequency vibratory cylindrical member has to be dimensionally sized so as to be able to resonate in relation to the frequency of the electric oscillation being imposed on the elements. However, since the above size is determined by the two factors of frequency and ordinal number of harmonic flexural vibration mode, it can be varied arbitrarily or is in no way limited of its range allowable, through free choice of the ordinal number of harmonic flexural vibration mode. According to the invention, therefore, it is possible to produce large-amplitude ultrasonic waves from the extensive area of vibration on the vibratory hollow cylindrical member including inner and outer cylindrical surfaces that can be provided with any dimensional size as desired.

The invention accordingly has an object to provide an ultrasonic wave generator capable of producing large-amplitude ultrasonic waves from throughout an extensive area.

The invention has another object to provide an ultrasonic wave generator wherein an ultrasonic-frequency vibratory member is not restricted of its dimensional size allowable.

The above and other objects and features of the invention will become apparent from the following description of specific embodiments made in conjunction with the accompanying drawings.

BRIEF DESCRIPTION OF THE DRAWINGS

FIG. 4 is an elevational view and partially sectional view of the second embodiment according to the invention;

FIG. 5 is an elevational view of the third embodiment according to the invention, however showing only an ultrasonic-frequency cylindrical vibratory member; and FIG. 6 is a diagrammatical view showing how the ultrasonic wave generator of the invention is applied to a humidifying apparatus.

DESCRIPTION OF THE PRESENTLY PREFERRED EMBODIMENTS

Figure 1:
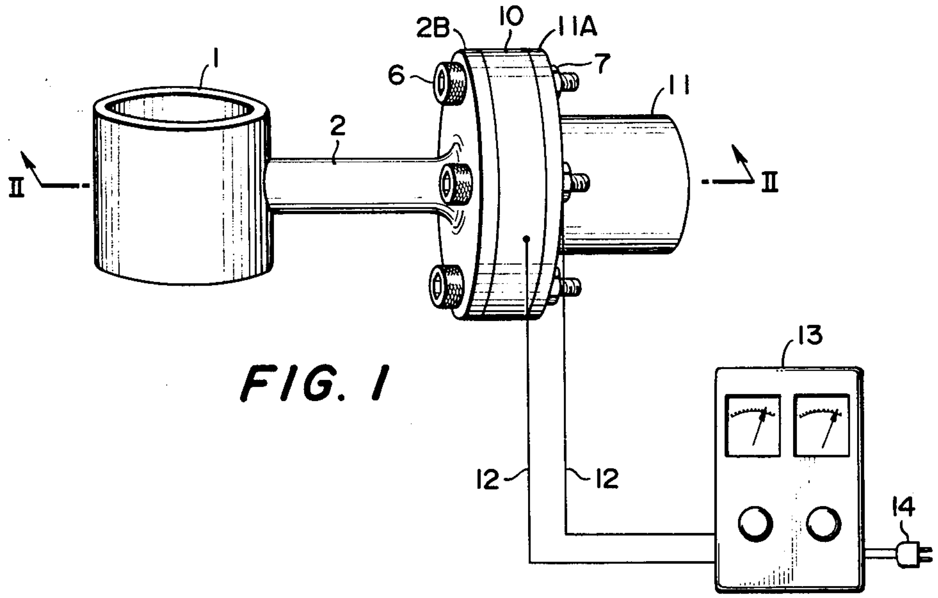
FIG. 1 is a perspective diagrammatical view of an ultrasonic wave generator constructed according to the first embodiment of the invention.
Figure 2:
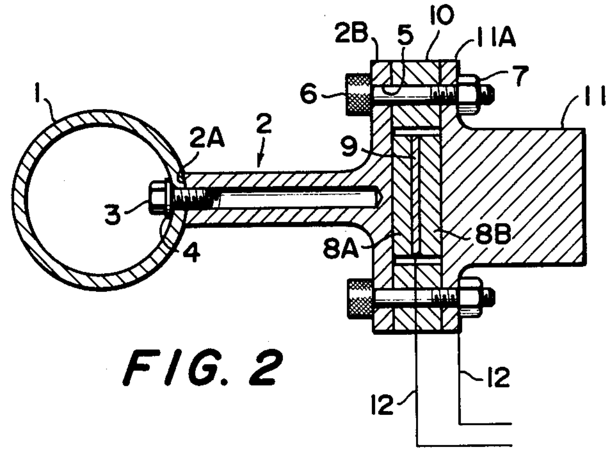
FIG. 2 is a longitudinal sectional view taken along the line II—II of FIG. 1.

Referring now to FIGS. 1 and 2 of the drawings, wherein the first embodiment of an ultrasonic wave generator according to the invention is illustrated, there is essentially provided a hollow cylindrical shaped ultrasonic-frequency vibratory member 1 having a side circular wall of a predetermined length or height as shown in FIG. 1 and a constant wall thickness in the axial direction over the entire end of its height as depicted in FIG. 2 secured, through a fastening bolt 3 and a washer 4, to the mechanical vibration output end 2A or distal end of an amplifier member 2 in the form of a metallic block for amplification of ultrasonic vibrations, in such a manner that the axis of the vibratory member is perpendicular relative to the direction of longitudinal vibrations of the amplifier member 2.

The proximal end of the amplifier member 2 is formed with an integral flange 2B having a number of bolt receiving holes 5 therearound. This flange 2B is coupled, by means of bolts 6 and cooperating nuts 7, with another flange 11A formed on a metallic block member for backing purpose 11 disposed in opposition to the flange 2B, with piezoelectric elements 8A, 8B, an electrode 9 and a spacer 10 being sandwiched between the two flanges.

The above piezoelectric elements 8A and 8B have respective positive poles faced to each other with the common electrode 9 sandwiched therebetween, while their negative poles being in contact with the flanges 23 and 11A, respectively. The spacer 10 is in the form of an annulus made of silicon rubber and the like. The spacer provides a number of holes through which the above described bolts 6 are to penetrate, and the center bore of the annular spacer is such designed as to accommodate therein the piezoelectric elements 8A, 8B and electrode 9, so that all of the parts are securely clamped between the flange 2B and 11A by means of the bolts 6 and nuts 7.

The electrode 9 and flange 11A are connected to respective lead wires 12 for electric oscillation input, which lead wires in turn are connected to the output terminal of an ultrasonic frequency oscillator 13. The output terminal of the oscillator 13 in the form of a connector 14 leads to a power source.

In the structure described above, it has been arranged in design that all of the vibratory member 1, amplifier member 2, piezoelectric elements 8A, 8B and backing member 11 attain a motion of resonance as one body at a predetermined frequency. To describe more specifically, the arrangement is such that the length of the amplifier member 2 extending from its mechanical vibration output end 2A to the end surface of the flange 2B corresponds to $\lambda/4$ or a quarter wavelength of the ultrasonic wave to be transmitted therethrough, while that of the backing member 11 is determined either theoretically or experimentally in such a manner that the end surface of the flange 2B be located at the vibrational node of the resonant structure.

Further, it has been contemplated that electric oscillations having frequencies identical to that of the above described resonance are applied to the piezoelectric elements 8A, 8B by means of the ultrasonic frequency oscillator 13.

The functional operation of the above embodiment will now be described as follows.

Upon switching on the oscillator 13 in connection with the power source, electric oscillations having frequencies identical to the resonant frequencies intended in the entire structure of the ultrasonic wave generator are imparted to the piezoelectric elements 8A, 8B, thereby mechanical displacements being produced.

These mechanical displacements cause the metallic block amplifier member 2 to effect longitudinal vibrations of the type having the vibrational node positioned at the end surface of the flange 2B. In this instance, the amplifier member 2 enlarges the amplitudes of vibration, and the mechanical energy of vibration with the thus enlarged amplitudes are transmitted to the hollow cylindrically shaped ultrasonic-frequency vibratory member 1 from the mechanical vibration output end 2A.

In consequence, the vibratory member 1 effects flexural vibrations of large amplitudes, thus producing ultrasonic waves having large amplitudes. This will now be shown and described more specifically by referring to FIG. 3. Assuming that the vibratory member 1 performs a motion of the fifth harmonic flexural vibrations, the member then presents a pattern of deformation, shown by the chain line X, in each half-cycle of vibration, and in the next half-cycle that of antiphase relative to the preceding one, as shown by the chain line Y. Thus, there are established a plurality of nodal lines which extend generally parallel to the axis of the vibratory member 1, the inner and outer surfaces thereof spaced from the nodal lines vibrating radially and equally as illustrated, in a harmonic pattern. There are 10 nodal lines shown in FIG. 3, since the fifth harmonic vibrational mode is therein illustrated. This cyclic motion of flexure, in the case of 40 KHz for example, repeats 40,000 times per second.

It will be appreciated, further, that the vibrating surface effective for generation of ultrasonic waves is made up of inner and outer cylindrical surfaces of the vibratory member 1.

Next, reference will be made to FIG. 4 wherein the second embodiment of the invention is illustrated. In this Figure, the same reference numerals as in the first embodiment are used for the same parts.

In this embodiment, there is shown an amplifier member in the form of a metallic block 2 which is composed of a mechanical vibration output portion 2C, a flange portion 2D and a mechanical vibration input portion 2E. The mechanical vibration output 2C connects at its distal end or outut end 2A a hollow cylindrically shaped ultrasonic-frequency vibratory member 1, while the mechanical vibration input portion 2E being connected to an ultrasonic electromechanical transducer of the ordinary type 15.

The electromechanical transducer 15, again, serves to transform electric oscillation into ultrasonic mechanical vibrations, and may be in the form of either piezoelectric type or magnetostrictive type. In the embodiment, there has been illustrated the arrangement of a piezoelectric transducer for the sake of example. As shown, the transducer 15 comprises piezoelectric elements 8A, 8B, an electrode 9 and cylindrical block portions 15A, 15B, all formed as one body in such a manner that the elements 8A, 8B have respective positive poles arranged face-to-face with each other with the electrode 9 sandwiched therebetween while their negative poles being kept in contact with the cylindrical block portions 15A and 15B, respectively. Reference numeral 12 indicates lead wires connected to an ultrasonic frequency oscillator 13.

The above ultrasonic electromechanical transducer 15 is connected integrally with the metallic block shaped amplifier member 2 through a fastening bolt 16 adapted to fit threadably in female-threaded holes 2F and 15C which have respectively been formed on the abutting faces of the cylindrical block portion 15A and mechanical vibration input portion 2E.

In the above described arrangement, it has been such designed that the length of the amplifier member 2 extending from the end surface of the flanged portion 2D to the mechanical vibration output end 2A is selected as corresponding to λ/4, or a quarter wavelength of the ultrasonic wave to be transmitted therethrough, while that of the mechanical vibration input portion 2E is determined either theoretically or experimentally in such a manner that the end surface of the flanged portion 2D be located at the vibrational node of the present structure, and the end surface of the mechanical vibration input portion 2E be located at the anti-node. It will of course be noted that although in this embodiment, the length of the amplifier member has been given specifically as one-quarter wavelength, it may alternatively be any odd multiple of one-quarter wavelength.

The functional operation of this embodiment will now be described as follows.

When the ultrasonic frequency oscillator 13 is actuated to impart electric oscillatory current to the transducer 15, the same electric oscillations are transformed into mechanical vibrations (longitudinal vibrations) by means of the piezoelectric elements 8A, 8B, so that there are generated ultrasonic vibrations of the type with the vibrational antinodes being positioned at both ends of the transducer 15.

The above ultrasonic vibrations are transmitted to the metallic block shaped amplifier member 2, which member 2 in turn effects a motion of longitudinal vibrations of the type with the vibrational node being positioned at the end surface of the flanged portion 2D. At the same time, the amplitudes are enlarged by the mechanical vibration output portion 2C, so that the amplified vibrations are transmitted to the hollow cylindrically shaped vibratory member 1 from the output end 2A.

Consequently, the vibratory member 1 will effect a motion of flexural vibrations of a predetermined ordinal number of harmonic vibration mode in like manner as the first embodiment.

Further, the invention will now be described of its third embodiment with reference to FIG. 5.

This mode of practice only differs from the previously described first and second ones in that the hollow cylindrically shaped ultrasonic-frequency vibratory member 1 is formed at a portion of its cylindrical wall with an axially extending slit-like opening 1A.

Figure 3:
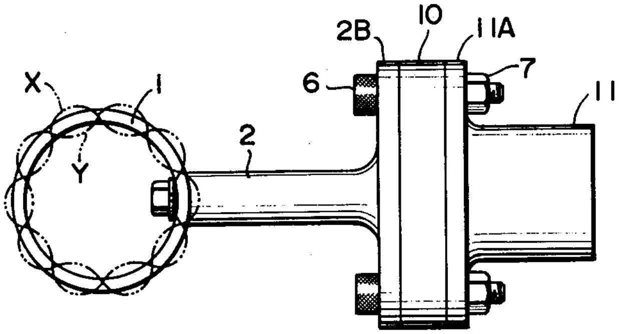
FIG. 3 is an elevational view of the same generator showing its operation.

Because of this opening, the vibratory member 1 will have resonant frequencies of flexural vibration different from those provided in the previous embodiments, however the pattern of vibration it produces will remain the same as shown by the chain lines in FIG. 3.

In all of the embodiments so far described, it is to be noted that the connections between the metallic block shaped amplifier member 2 and cylindrical shaped vibratory member 1; the flange 2B of the amplifier member 2 and flange 11A of the backing block member 11 with the spacer 10 sandwiched therebetween; and between the amplifier member 2 and transducer 15, may be formed not only by the fastening bolts described but also formed otherwise, such as by bonding, etc.

Further, since the amplification factor obtainable by the vibratory block member 2 is determined by the area ratio of the cross-sectional area at the end face of the backing block member 11 (or cylindrical block portion 15A) to that at the mechanical vibration output end 2A, it would be more advantageous to design the vibratory member so that instead of being solid, the member is longitudinally centrally hollowed from its output end 2A as far at least as near the flange 2B, thus resulting in a more diametrical increase of the member 2. This hollow configuration advantageously provides the amplifier member 2 with bending strength greater than that in a diametrically smaller member of solid block structure, so that there will hardly be the likelihood of incurring flexural vibrations detrimental to the desirable stiffness of connection between the vibratory member 1 and amplifier member 2.

Finally, the ultrasonic wave generator of the invention will be described of its industrial application to a humidifier as incorporated in a water-spray chamber. (See FIG. 6.)

As shown in FIG. 6, the ultrasonic wave generator of the invention is mounted on the lower wall of a water-spray chamber 18 of the humidifier 17 in a manner that the cylindrically shaped ultrasonic-frequency vibratory member 1 protrudes in the spray chamber 18 with its axis being in coincidence with that of the chamber 18.

The spray chamber 18 is opened at one end, and the other end is in communication with the exit of a blast pipe 19. Within the blast pipe 19, is provided a fan 20A driven by a motor 20, and at the entrance and side wall of the blast pipe 19, are provided air intake ports 19A.

Within the spray chamber 18, are provided water supply jets 21 as extending inwardly with their extremities positioned adjacent to the flat end surface, facing toward the blast pipe 19, of the cylindrically shaped ultrasonic-frequency vibratory member 1.

The water supply jets 21 are in communication with an annular water chamber 22 formed around the spray chamber 18, which annular chamber 22 in turn is in communication with an overhead water vessel 25 through a pipe 24 having a cock 23. With this arrangement, it is adapted that water from the vessel 25 is fed, via the water supply jets 21, onto the surface of the vibratory member 1. Reference numeral 12 in the Figure indicates lead wires, and 13 indicates an ultrasonic frequency oscillator.

The above humidifier 17 incorporating the invention will now be described of its operation.

Upon actuation of the oscillator 13, the cylindrically shaped vibratory member 1 causes a motion of large-amplitude vibrations. By the action of the fan 20A driven by the motor 20, the flow of air from the intake ports 19A is conducted through the blast pipe 19 to the spray chamber 18, while the supply of water from the vessel 25 being conducted, through the pipe 24, with the cock 23 opened, water chamber 22 and water supply jets 21, to the surface of the vibratory member 1.

The volume of water thus brought onto the surface of the vibratory member 1 will spread out on the inner and outer cylindrical surfaces to form aqueous films, which films then are broken under the influence of ultrasonic wave vibrations into groups of particles while being dispersed away from the vibrating surfaces, thereby all of the water supplied into the spray chamber 18 being atomized.

This spray of water is entrained on the flow of air from the fan 20A, and released from the open end of the spray chamber 18 into the outside to effect humidification of the air. In this arrangement of humidifier, it will be assured that the rate of water atomization attainable in a given length of time increases due to a greater extensive are of vibration provided by the vibratory member of the invention.

The invention has so far been described of its industrial application to a humidifier, but it is in no way limited to such use. Instead, the ultrasonic wave generating system of the invention may equally be applied to the fields of atomizing liquids into aerosols (e.g., carburetor), fluid emulsifying devices, emulsifying and agitating devices, accelerators for chemical reaction in gases, and cleaning apparatus.

What is claimed is:

1. An ultrasonic wave generator comprising:

a hollow cylindrically shaped ultrasonic frequency vibratory member open at both ends which has a side circular wall having a predetermined length between ends of said hollow cylindrically shaped member and a constant wall thickness in the axial direction of said hollow cylindrically shaped member;

means for flexurally vibrating said vibratory member so that plural nodal lines extend generally parallel to the axis thereof with the inner and outer surfaces of said member spaced from said nodal lines vibrating radially and equally in a harmonic vibration pattern comprising:

an ultrasonic frequency oscillator;

an ultrasonic electromechanical transducer for transforming electric oscillations generated by said ultrasonic frequency oscillator into mechanical longitudinal vibrations; and an amplifier member for amplification of ultrasonic vibrations integrally connected to the output of said ultrasonic electromechanical transducer, said amplifier member having its output end integrally connected to said hollow cylindrically shaped ultrasonic frequency vibratory member with the axis thereof being in perpendicular relation to the axis of said vibratory member whereby said amplified mechanical longitudinal vibrations are converted to ultrasonic vibrations of both the inner and outer surfaces of said vibratory member.

2. An ultrasonic wave generator according to claim 1, wherein said ultrasonic electromechanical transducer is a piezoelectric type transducer.

3. An ultrasonic wave generator according to claim 1, wherein said ultrasonic electromechanical transducer is a magnetostrictive type transducer.

4. An ultrasonic wave generator according to claim 1, wherein said hollow cylindrically shaped ultrasonic-frequency vibratory member is a hollow cylinder having an axially extending slit like opening.

5. An ultrasonic wave generator according to claim 1, wherein said piezoelectric type transducer is in the form of a pair of piezoelectric elements with an electrode plate sandwiched therebetween which are interposed and fixed between two metallic blocks by fixing means.

6. An ultrasonic wave generator according to claim 1 wherein the length of said amplifier member is an odd multiple of one-quarter wave length of the ultrasonic waves to be transmitted therethrough.

7. An ultrasonic wave generator comprising:

an ultrasonic frequency oscillator;

an ultrasonic electromechanical transducer for transforming electric oscillations generated by said ultrasonic frequency oscillator into mechanical longitudinal vibrations;

an amplifier member for amplification of ultrasonic vibrations integrally connected to the output end of said ultrasonic electromechanical transducer;

a hollow cylindrically shaped ultrasonic-frequency vibratory member which has a side circular wall having a predetermined length between ends of said hollow cylindrically shaped member and a constant wall thickness in the axial direction of said hollow cylindrically shaped member and integrally connected to the output end of said amplifier member with the axis thereof being in perpendicular relation to the axis of said amplifier member, said hollow cylindrically shaped vibratory member having an axially extending slit-like opening at a free end away from its connection to said amplifier member.

8. An ultrasonic wave generator comprising:

an ultrasonic frequency oscillator;

a piezoelectric transducer for transforming electric oscillations generated by said ultrasonic frequency oscillator into mechanical longitudinal vibrations, said piezoelectric transducer comprising a pair of piezoelectric elements with an electrode plate sandwiched therebetween which are interposed and fixed between two metallic blocks by fixing means;

an amplifier member for amplification of ultrasonic vibrations integrally connected to the output end of said ultrasonic electromechanical transducer; and a hollow cylindrically shaped ultrasonic-frequency vibratory member open at both ends which has a side circular wall having a predetermined length between ends of said hollow cylindrically shaped member and a constant wall thickness in the axial direction of said hollow cylindrically shaped member, said hollow cylinder further having an axially extending slit-like opening at a free end away from its connection to said amplifier member and being integrally connected to the output end of said amplifier member with the axis thereof being in perpendicular relation to the axis of said amplifier member.

* * * * *